United States Patent [19]

Sikes

[11] 4,042,843
[45] Aug. 16, 1977

[54] VOLTAGE LEVEL ADAPTION IN MOSFET CHIPS

[75] Inventor: Wayne Alan Sikes, Northridge, Calif.

[73] Assignee: Electronic Arrays, Inc., Mountain View, Calif.

[21] Appl. No.: 583,863

[22] Filed: June 5, 1975

[51] Int. Cl.² ........................................... H03K 17/00
[52] U.S. Cl. .................................. 307/297; 307/304; 323/22 R
[58] Field of Search ............... 307/297, 304, 251, 279, 307/235; 323/22 R, 22 T, 22 Z

[56] References Cited

U.S. PATENT DOCUMENTS

| 3,657,575 | 4/1972 | Taniguchi et al. | 307/235 X |
| 3,808,468 | 4/1974 | Ludlow et al. | 307/297 |
| 3,823,332 | 7/1974 | Feryszka et al. | 307/297 |
| 3,881,041 | 8/1974 | Krambeck et al. | 307/297 |

OTHER PUBLICATIONS

FET Device Parameter Compensation Circuit by Askin et al., IBM Tech. Bultn., vol. 4, No. 7, 12/71, p. 2088.

Primary Examiner—Stanley D. Miller, Jr.
Assistant Examiner—B. P. Davis
Attorney, Agent, or Firm—Ralf H. Siegemund

[57] ABSTRACT

A particular voltage level in an integrated MOS chip is maintained by defining that level as an integral multiple of drain-to-gate voltage thresholds and by actively controlling that level in response to deviations therefrom. Plural MOSFET elements are connected in circuit so that their drain-to-gate capacitances are serially effective across internal signal lines (e.g. busses) for bias so as to establish a reference level to be compared with the actual voltage on these signal lines; and through feedback the signal level as applied from outside of the chip to these lines or busses is reduced to obtain the desired multiple threshold voltage as operating voltage on these lines for use by other elements in the chip.

4 Claims, 4 Drawing Figures

VOLTAGE LEVEL ADAPTION IN MOSFET CHIPS

BACKGROUND OF THE INVENTION

The present invention relates to integrated circuits of the MOS variety and more particularly to the voltage and/or signal supply for the active elements in such a circuit, called MOSFETs, for operation and bias thereof.

It is a known fact that integrated circuit chips as made in large quantities vary to some extent from batch to batch. These variations may stay within specified tolerances, and they may not, and whenever these tolerances are exceeded, the chip (or even an entire batch) is not deemed useable. Process control of course will tend to keep to the yield high, but, it has to be observed that the tolerances deemed still acceptable are, to some extent, arbitrary and the result of compromise. Principle criterion is adequate operation of a chip as such and within particular performance requirements particularly with regard to adequate cooperation with other chips (usually not from the same batch) as well as with other e.g. discrete circuit elements.

As integrated chips cooperate with others, the signal and other voltage levels applied and passing between them must be and are usually based on averages which are deemed adequate for operation of all circuit elements and chips of the interconnected system, and the tolerances have been referenced with regard to that average.

Integrated circuit chips are usually used as and in logic circits so that the essential internal criterion is the ready distinction between logical or digital "ones" and "zeros". This distinction is usually defined and established by distinguishing between conduction and non-conduction of FET elements in the chip. Logic states or numbers "one" and "zero" propagate through the chip from element to element until combined with others to form a new output state. If that propagation is extensive, it cannot be expected that the voltage levels defining that state remain invariable. Moreover, control voltages are usually established internally as node charges and they must be expected to differ in level for similar logic states they are supposed to define. Maintaining distinguishable voltage levels here is the primary objective, and for attaining that objective, one has to define tolerances as criterion (usually as test criterion to separate the useful devices from those that might cause difficulties), under which conditions a FET should or should not conduct. The yield of MOSFET chip processing is directly related to the closeness of these performance tolerances.

DESCRIPTION OF THE INVENTION

It is an object of the present invention to increase the effective yield as to production of integrated MOSFET chips, without change of the process but by means of design that permits wider tolerances.

The invention is based on the recognition that a field effect transistor exhibits a so called conduction threshold which is usually a few volts (2 to 3 volts) and is the result of the fact, that a voltage below the threshold merely traps electrons and does not render them available for conduction. Thus, the gate must receive a minimum voltage before any conduction of electrical current (beyond leakage) can be observed. That threshold depends on, among other aspects, the thickness of the insulation (oxide) between the gate electrode and the substrate, and on the doping concentration in the substrate in which the conduction channel is set up, directly underneath the oxide layer.

This threshold may vary significantly from chip to chip so that the onset and cessation of conduction varies accordingly. The several integrated circuit chips (often many or even a very large number) receive and are operated by a particular voltage as external power supply. This external voltage has, of course, the same value for all the chips. However, the MOSFETs in different chips having different thresholds will conduct or cease to conduct at different levels. The permissible differences here define (or contribute to) the tolerance range so that a chip with MOSFETs having a high threshold can still adequately cooperate with a chip with MOSFETs having a low threshold.

It is a specific object of the present invention to widen that range of permissible differences.

In accordance with the preferred embodiment and principles of the present invention, it is suggested to provide each chip with its own internal voltage and power supply and/or signal level adaptor in that the or a specific supply and operating voltage to be effective in the chip is composed of existing threshold voltage levels of that chip. The difference in potential between e.g. an internal ground bus and a supply bus for operating voltage or an information bearing signal is held for example to an integral multiple of conduction threshold values which are established by a plurality of MOSFET elements being connected across these busses so that their thresholds are summed additively and the circuit connection is made to hold the voltage between these busses to that integral multiple.

In realizing the invention, one may use these serially connected FETs as a reference structure for a feedback loop which also senses the actual voltage on the busses, and an error signal is formed to control the voltage as applied from an external source to these busses to reduce the error signal to zero.

One can also say, that serially connected drain-to-gate capacitances when connected across the two busses distribute the voltage thereon to render the devices to which they pertain conductive when that voltage exceeds the sum of their threshold voltages and nonconductive when that voltage is below that sum of the thresholds. Additional circuitry senses the dividing line of onset/cessation of conduction and changes the voltage as applied to these busses to be equal to that sum of inherent threshold levels of the device. For this one may use the effective voltage on these devices as reference for a comparison to generate an error signal that provides for the active control of the voltage on the busses.

It can thus be seen that each chip in a large assembly, though receiving the same external supply voltage, prepares that voltage in accordance with its own needs. The supply voltage for the active circuit elements in the chip is made low for low conduction thresholds, and high for high threshold levels. The conduction threshold is quite uniform throughout a chip, but as stated, varies from chip to chip and, upon practicing the invention, may vary over a significantly larger range than heretofore permissible.

The invention is, of course, not merely applicable to the voltage supply as such, but also to the transfer of signals which may have been generated on a chip, amplified externally for transmission across connections other than internal ones in integrated circuits, and is applied now to a chip at a high level, but reduced to a level that is an integral multiple of thresholds in the receiving chip.

The circuit with feedback control has the added advantage, that the external voltage can even be unregulated as the chip-internal circuit provides for its own regulation to the externally needed power and signal supply level.

DESCRIPTION OF THE DRAWINGS

While the specification concludes with claims particularly pointing out and distinctly claiming the subject matter which is regarded as the invention, it is believed that the invention, the objects and features of the invention, and further objects, features and advantages thereof will be better understood from the following description taken in connection with the accompanying drawings in which:

Proceeding now to the detailed description of the drawings, FIG. 1 shows generally an integrated circuit chip 10 of the MOS variety and containing a multitude of MOSFETs and other circuit elements. The active circuit elements in this chip receive an internal operating voltage $V_i$ to be taken between a bus $V_{dd}$ and a bus $V_{ss}$. In order to relate that operating voltage to the specific conditions of the specific chip, it should bear a definite relation to the threshold voltage of each MOSFET element. For this reason, the voltage $V_i$ is composed of MOSFET threshold values $V_T$ as they actually exist, and independently from the voltage $V_e$ that is being applied externally.

Figure 1:
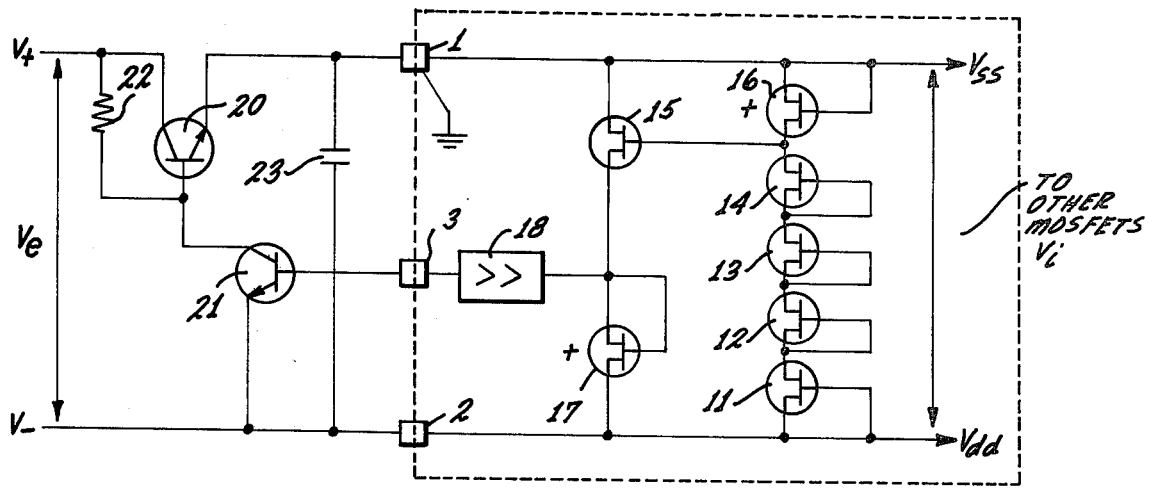
FIG. 1 is a circuit diagram of the preferred example of the preferred embodiment of the invention.

The basic configuration is established by four serially connected MOSFETs 11 through 14, which are connected as a serial string of elements beginning at the terminal having the potential $V_{dd}$. The connection is made internally in the chip 10. The gate electrodes of MOSFETs 11 through 14 are connected to bias each of these MOSFETs in the regular enhancement mode.

The drain electrode of FET 14 is connected to the gate of another MOSFET 15 whose gate to drain threshold voltage provides the fifth one that is serially effective as between busses $V_{ss}$ and $V_{dd}$.

The drain electrode of FET 14 is additionally connected to a FET 16 which is constructed as a depletion device. Accordingly, its gate is also connected to $V_{ss}$. Such a device as operating in the depletion mode has a significantly smaller conduction threshold, so that its threshold does not interfere with the operation and particularly FET 16 is still capable of conducting electrical current for voltages which are below the conduction threshold as effective between drain and gate of FET 15.

The transistor 15 has an additional function; namely, it is one component of an inverter. Another depletion device transistor 17 is serially connected between the source of FET 15 and $V_{dd}$. The transistors 15 and 17 together establish the inverter, whose output junction can swing between values close to $V_{dd}$ and $V_{ss}$. For reasons of sufficient gain, another pair of inverters 18 may be cascaded between the junction of transistors 16 and 17. These inverters may be similarly constructed as the one illustrated in detail (15, 17).

The arrangement as described has in effect three interface connections 1, 2, 3 as between the chip 10 and external, discrete circuit elements. The connections 1 and 2 lead to internal busses $V_{dd}$ and $V_{ss}$ and connection 3 is the output of double inverter 18. The terminal 1 is connected to ground as effective externally and, through a bipolar transistor 20, to the positive terminal $V_+$ of a d.c. voltage source. Terminal 2 connects directly to the negative terminal $V_-$ of that voltage source.

The voltage between terminals $V_-$, $V_+$ is denoted $V_e$ and may be selected so that it is well above the level $V_i$ needed for internal chip operation. The voltage $V_i$ will be established to $V_i = 5 \times V_T$ by operation of the circuit to be described. The external supply voltage $V_e$ should be higher than the voltage $V_i$ to be composed for the particular chip, or for any other chip expected to be used within a system which uses $V_e$ as voltage supply.

The base of transistor 20 is connected to the collector-emitter path of a transistor 21 whose emitter is connected to $V_{dd}$, or 2, or $V_-$ (all having the same potential), and whose base is connected to terminal 3, i.e. to the output of amplifier 18. A resistor 22 is connected around the collector-base path of transistor 20. A capacitor 23 interconnects terminals 1 and 2 to reduce frequency response and prevents hunting. In essence, capacitor 23 bridges brief changes in the supply voltage.

The device operates as follows. If for any reason the voltage $V_i$ is less than 5 voltage drops $V_T$, none of the transistors 11 to 15 can conduct. These transistors act in effect as five serially interconnected capacitors and distribute the total voltage among them accordingly, i.e. approximately equally, and none of the resulting capacitance charges establishes a voltage above conduction threshold for the respective FET. Depletion transistor 16 is conductive and holds the gate of transistor 15 to a value near $V_{ss}$ (at less than a single threshold value) so that FEt 15 is definitely turned off. There may be some current flow through devices 11 to 14 if the voltage $V_i$ is only a little less than 5 $V_T$, but per se, the gate-to-drain voltage on FET 15 is held to a value below the conduction threshold $V_T$. Accordingly, depletion transistor 17 applies $V_{dd}$ potential to the input of double inverter 18, and the latter turns off bipolar transistor 21 or holds it to low conduction. Most of the current from $V_+$ and flowing through resistor 22 flows out of the emitter of transistor 20 and turns it on fully to reduce its effectiveness as serial resistor in the $V_+$-to-$V_{ss}$ path. The charge across capacitor 23 increases until the voltage $V_i$ as between busses $V_{ss}$ and $V_{dd}$ equals five threshold drops, bringing each of the transistors 11 to 15 to the verge of conduction.

If $V_{ss} - V_{dd}$ exceeds five threshold values $V_T$, transistor 15 is turned on fully and the voltage at the junction of 15 and 17 shifts away from $V_{dd}$ so that transistor 21 is turned on which in turn causes some of the current through resistor 22 to by-pass transistor 20 and that in turn reduces conduction therethrough. The load current will reduce the $V_{ss} - V_{dd}$ drop to a value of $5.V_T$.

It can thus be seen, that for steady operation which is the principle purpose of the device, the voltage $V_i$ across busses $V_{ss} - V_{dd}$ settles to a value $V_i = 5.V_T$ wherein a particular impedance drop is produced in transistor 20 by operation of the feedback 15, 17; 18; 3; and 21.

The dynamic situation outlined above permits additionally that the voltage source $V_-$, $V_+$ is more or less unregulated. The circuit as described does not only adapt the effective (steady) voltage level to the existing internal conditions but variations (in time) and occurring for any reason are also eliminated. The capacitor 23 is actually provided just for reasons of that additional function. As far as static control is concerned for establishing $5\ V_i$ as internal supply voltage, that capacitor is not needed. The variations which are eliminated by the circuit may have external causes such as changes in the external supply, or internal reasons by virtue of transient conditions, switching coincidences etc. or even externally or internally induced noise.

Figure 2:
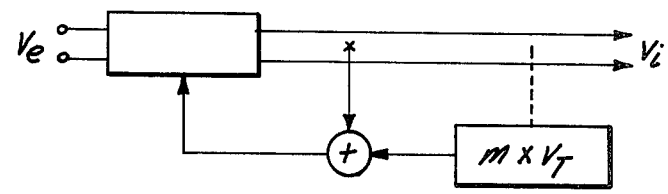
FIG. 2 is a block diagram of the circuit of FIG. 1 drawn for purposes of explaining the circuit of FIG. 1 as a feedback control circuit.

The circuit as described can be understood as a feedback loop as explained with reference to FIG. 2. The circuit elements 11 to 15 establish the value $5\ V_T$ as reference, not just by operation of their being connected across busses $V_{ss}$, $V_{dd}$, but by the inherency of their construction and interconnection. Their connection across the busses $V_{ss}$, $V_{dd}$ establishes them as reference signal source and as negative summing point for the generation of an error signal which is taken from the source of transistor 15. Transistor 16 can be deemed to sense the variable conduction, and the common junction and node of elements 14, 15 and 16 constitutes actually the negative summing point for the generation of the error signal. Elements 17, 18 and 21 establish the error signal amplifier and 20 is the controller or actuator whose output becomes the controlled variable, namely $V_i$. The value $5\ V_i$ is made available as a reference in the circuit, not as a signal as such, but as an internal structure condition. Its effectiveness as a signal is generated only upon bias and in conjunction with the sensing of the controlled variable as well as the formation of the error signal.

The number "5" as integral multiple of $V_T$ for composing $V_i$ is not critical but found to be preferred and to be the most practical one.

Returning for the moment to the circuit of FIG. 1, it should be noted that current flow through the transistor 16 is not dependent on the threshold $V_T$ for the enhancement mode transistors. Both depletion transistors (and possibly others in 18) are fully effective to charge or discharge any capacitances of transistor devices respectively serially connected thereto. Particularly transistor 16 provides for active control within the assembly 11 to 15 when otherwise no current flow is permitted through these devices, but particular output changes must occur at the source electrode of transistor 15 for generation of the error signal. Conduction through depletion device 16 and variations thereof are instrumental here.

It should be mentioned further, that the invention can also be practiced as a signal level adaptor, if $V_e$, for example, varies between 0 and a full signal level. The zero level may require an additional circuit element which applies e.g. ground potential to terminal 2 if the logic condition so requires, short-circuiting capacitor 23. The circuit will be used to adapt the external signal level to a specific level, equal to $5\ V_T$.

Figure 3:
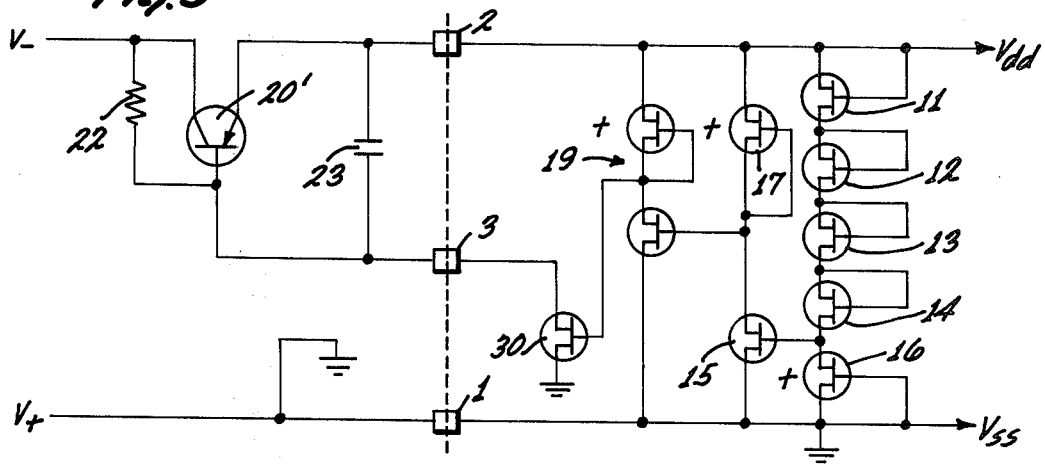
FIGS. 3 and 4 are circuit diagrams of other examples of the preferred embodiment of the invention.

The particular circuit illustrated in FIG. 1 exhibits a particular line of division as between internal and external devices. FIG. 3 illustrates a modification which permits omission of transistor 21 as an external element. The assembly 11 through 17 is the same as in FIG. 1 but only a single inverter 19 is connected to the inverter 15, 17, being otherwise of similar construction.

An external control transistor as well as a resistor 22 is also provided here; however, the control transistor, being denoted 20' is of the opposite type. Moreover, the base of transistor 20' connects directly to interface connection or terminal 3 while transistor 20 is serially interposed in the $V_+$-$V_{dd}$ path via terminal 2. This modification is not of any significance, but demonstrates merely, that the voltage drop for reducing $V_e$ to the specific value $V_i$ can be produced in the $V_+$-to-$V_{ss}$ path as well as in the $V_-$-to-$V_{dd}$ path. These connections are interchangeable and are not tied to the specific internal connections of the two examples of FIGS. 1 and 3.

A FET 30 of rather large configuration is connected with its source-drain path across terminals 1 and 3 so that the base to ground current from control transistor 20' runs into and out of the chip, through FET 30 therein.

The operation as far as elements 11 to 17 is concerned is similar to the one described. For $V_i < 5\ V_i$ the junction of FETs 15, 17 has potential $V_{dd}$, so that transistor 30 is turned off via inverter 19. Thus, transistor 20 is fully on and a more positive potential is applied to the base of the transistor so that the potential of terminal 2 goes up. For $V_i 5\ V_T$, transistor 15 begins to (or does) conduct, and the input of inverter 19 tends to go to ground and its output swings towards (or is held at) a potential closer to $V_{dd}$, rendering transistor 30 conductive to provide the by-pass for current flow that was provided above by transistor 21. As before, stable conditions settle the conduction through 20' to a value so that $V_i - 5\ V_T$.

Figure 4:
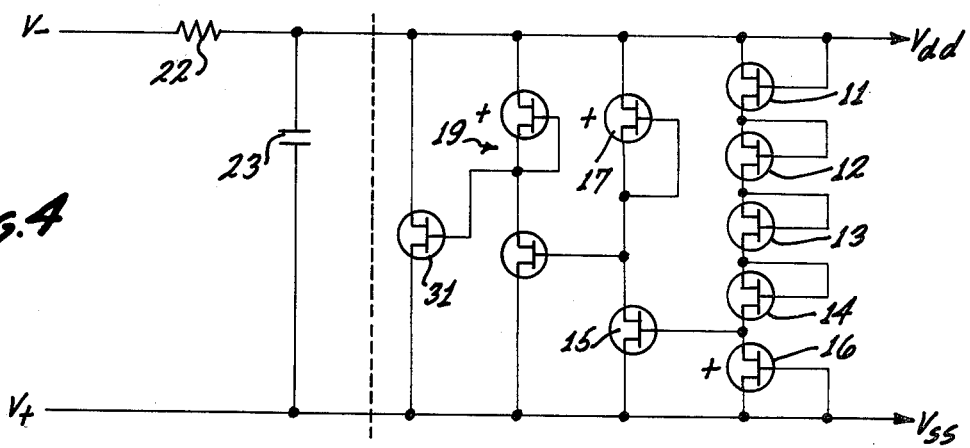

FIG. 4, finally, shows only an RC current as external element, and the inverters 15, 17 and 19 control a by-pass transistor 31, which, in effect, serves as internal discharge control transistor for the capacitor 23 so that the capacitor voltage is held to $V_i = 5\ V_T$ level.

Actually, the resistor 22 could also be included in the chip as an impedance device, so that the entire feedback circuit would be on the chip. A comparison among the Figures shows however, that it is clearly preferred to run all of the by-pass current through elements outside of the chip. These currents result, ultimately, from too high an external voltage or even from external votage surfaces and peaks. Therefore, these currents have to some extent unpredictable magnitude so that protection of the chips against overload current requires excess current to remain external to the chip.

Devices 30 and 31 when included in the chip, will have to be quite large which takes away space which is otherwise available space on the chip for active circuit elements. On the other hand, if voltage $V_e$ is not too high and is kept constant already by operation of voltage regulation, the voltage level adaptation circuit is needed for just that purpose, and in that case some or all of the circuit can be placed on the chip.

The invention is not limited to the embodiments described aove but all changes and modifications thereof not constituting departures from the spirit and scope of the invention are intended to be included.

I claim:

1. In an integrated circuit chip of the MOS variety and which includes a plurality of individual, active FET elements each having a particular conduction threshold defined by a particular threshold voltage and each needing a bias voltage for operation, the chip including a pair of busses to which particular potentials applied from external sources, the operating voltage for these FET elements being taken from these busses, the improvement of a plurality of FET elements having their drain-to-gate capacitances effectively connected serially between said busses;
first circuit means included in the chip and connected to monitor whether the voltage on said busses is sufficient to place all of the FET elements of the plurality to the verge of conduction; and
second circuit means external to the chip and connected to the first circuit means and receiving the potentials as applied from said external source, to control the voltage on said busses in response to deviations from near-conduction of all said FET elements of the plurality as monitored by the first circuit means.

2. In an integrated circuit chip of the MOS variety and which includes a plurality of individual, active FET elements each having a particular conduction threshold defined by a particular threshold voltage and each needing a bias voltage for operation, the chip including a pair of busses to which particular potentials are applied from external sources, the operating voltage for these FET elements being taken from these busses, the improvement of a plurality of FET elements having their drain-to-gate capacitances interconnected serially so that the resulting circuit establishes the sum of the conduction thresholds of the elements of the plurality as a reference condition; and
circuit means comprising first circuit means included in the chip and second circuit means external to the chip connected to said busses and to said elements for controlling the voltage between said busses to equal said reference condition.

3. In an integrated circuit chip of the MOS variety and which includes a plurality of individual, active FET elements each having a particular conduction threshold defined by a particular threshold voltage and each needing a bias voltage for operation, the chip including a pair of busses to which particular potentials are applied from external sources, the operating voltage for these FET elements being taken from these busses, the improvement of a plurality of FET elements having their drain-to-gate capacitances interconnected serially so that the resulting circuit establishes the sum of the conduction thresholds of the elements of the plurality as a reference condition;
first circuit means included in the chip for connecting said elements in the plurality to said busses for generating an error signal representing deviation of the voltage on the busses from the reference condition; and
second circuit means comprising third circuit means included in the chip and fourth circuit means external to the chip connected to said first circuit means for controlling the voltage on the busses in response to said error signal.

4. In an integrated circuit chip as in claim 3:
the FEt elements including first ones each having its gate connected directly to its source, the first ones of the elements connected serially to each other, one of the first ones being connected with its source to one of the busses, the drain of a last one of the first ones in the serial connection being provided for further connection;
a second one of the FET elements being included in the first circuit means and having its gate connected to the drain of said last one and its drain to the other one of the busses;
the first circuit means including a depletion mode transistor connected with its source-to-drain path between the drain of said last one of the elements and said other bus; and
a variable impedance device as part of said fourth circuit means connected between one of said busses, and an external signal source and further connected to operate in response to a signal as provided by the source electrode of said second element.

* * * * *